United States Patent
Fagg et al.

(10) Patent No.: US 9,577,608 B2
(45) Date of Patent: Feb. 21, 2017

(54) DISCRETE TIME LOWPASS FILTER

(75) Inventors: Russell John Fagg, San Diego, CA (US); Joseph Patrick Burke, Glenview, IL (US)

(73) Assignee: QUALCOMM Incorporated, San Diego, CA (US)

( * ) Notice: Subject to any disclaimer, the term of this patent is extended or adjusted under 35 U.S.C. 154(b) by 1004 days.

(21) Appl. No.: 12/541,834

(22) Filed: Aug. 14, 2009

(65) Prior Publication Data

US 2011/0040818 A1  Feb. 17, 2011

(51) Int. Cl.
 G06F 17/17 (2006.01)
 H03H 19/00 (2006.01)
 H03H 15/00 (2006.01)
 H03H 17/06 (2006.01)

(52) U.S. Cl.
 CPC ......... *H03H 19/004* (2013.01); *H03H 15/023* (2013.01); *H03H 17/0657* (2013.01); *H03H 17/0664* (2013.01)

(58) Field of Classification Search
 None
 See application file for complete search history.

(56) References Cited

U.S. PATENT DOCUMENTS

| | | | |
|---|---|---|---|
| 4,653,017 A | | 3/1987 | Colbeck et al. |
| 4,893,316 A | * | 1/1990 | Janc et al. .................. 708/300 |
| 5,289,059 A | | 2/1994 | Pikkarainen |
| 5,966,188 A | * | 10/1999 | Patel et al. .................. 348/726 |
| 7,145,483 B2 | * | 12/2006 | Walker .......................... 341/56 |
| 2006/0071707 A1 | | 4/2006 | Belveze et al. |
| 2006/0141973 A1 | * | 6/2006 | Behrens et al. ............. 455/313 |
| 2006/0195883 A1 | * | 8/2006 | Proctor et al. .............. 725/127 |
| 2007/0001754 A1 | * | 1/2007 | Lakdawala ........... H03H 15/00 327/552 |
| 2008/0130769 A1 | * | 6/2008 | Papadopoulos et al. ..... 375/260 |
| 2008/0133183 A1 | * | 6/2008 | Hellberg ...................... 702/190 |
| 2009/0284285 A1 | * | 11/2009 | Fagg ............................... 327/91 |

(Continued)

OTHER PUBLICATIONS

Ciota Z et al., "Analogue realisation of integrated FIR filters", IEE Proceedings: Circuits Devices and Systems, Institution of Electrical Engineers, Stevenage, GB, vol. 143, No. 5, Oct. 8, 1996 (Oct. 8, 1996), pp. 274-281, XP006006133, ISSN: 1350-2409, DOI:10.1049/IP-CDS:19960611.

(Continued)

*Primary Examiner* — Henry Tsai
*Assistant Examiner* — Aurangzeb Hassan
(74) *Attorney, Agent, or Firm* — James Gutierrez

(57) ABSTRACT

A discrete time (DT) lowpass filter having various advantages is described. In an exemplary design, the DT lowpass filter includes a decimating DT filter (which may include a passive DT FIR filter and/or a passive DT IIR filter) and an active DT filter. The decimating DT filter receives a first DT signal at a first sample rate, filters and decimates the first DT signal by a factor of N, and provides a second DT signal at a second sample rate lower than the first sample rate. N may be greater than one. The active DT filter filters the second DT signal and provides a third DT signal at the second sample rate. A sampler samples a continuous time signal and provides the first DT signal. The sampler may further double the voltage of the first DT signal relative to the voltage of the continuous time signal.

27 Claims, 11 Drawing Sheets

(56) References Cited

U.S. PATENT DOCUMENTS

2010/0158178 A1* 6/2010 Sobchak et al. ............... 375/355
2010/0167685 A1* 7/2010 Burke et al. .................. 455/341

OTHER PUBLICATIONS

Daniel C. Von Grunigen et al., "Integrated Switched-Capacitor Low-Pass Filter with Combined Anti-Aliasing Decimation Filter for Low Frequencies", IEEE Journal of Solid-State Circuits, vol. SC-17, No. 6, Dec. 1, 1982 (Dec. 1, 1982), pp. 1024-1029, XP002619996.

Gray P.R. et al., "A low-noise chopper-stabilized differential switched-capacitor filtering technique", IEEE Journal of Solid-State Circuits, vol. 16, No. 6, Dec. 1, 1981 (Dec. 1, 1981), pp. 708-715, XP55002080, ISSN: 0018-9200, DOI:10.1109/JSSC.1981.1051666.

Hirata Y et al., "High frequency switched capacitor IIR filters using parallel cyclic type circuits", Proceedings of the International Symposium on Circuits and Systems (ISCAS), San Diego, May 10-13, 1992, New York, IEEE, US, vol. 3, May 3, 1992 (May 3, 1992), pp. 1199-1202, XP010061431, DOI: DOI:10.1109/ISCAS.1992.230310 ISBN: 978-0-7803-0593-9.

International Search Report and Written Opinion—PCT/US2010/045535, ISA/EPO—Jul. 22, 2011.

Mostafa M A I, et al., "WCDMA receiver architecture with unique frequency plan" Sep. 12, 2001 (Sep. 12, 2001), ASIC/SOC Conference, 2001. Proceedings, 14th Annual IEEE International Sep. 12-15, 2001, Piscataway, NJ, USAJEEE, pp. 57-61 , XP010560756 ISBN: 9780780367418 p. 58, right-hand column, paragraph 2; figure 5.

Quinn P et al., "Capacitor matching insensitive algorithmic ADC requiring no calibrations", Integration, The VLSI Journal, North-Holland Publishing Company, Amsterdam, NL, vol. 36, No. 4, Nov. 1, 2003 (Nov. 1, 2003), pp. 211-228, XP004476846, ISSN: 0167-9260, DOI:10.1016/J.VLSI.2003.09.004.

Rahim Bagheri et al., "An 800-MHz-6-GHz Software-Defined Wireless Receiver in 90-nm CMOS", IEEE Journal of Solid-State Circuits, IEEE Service Center, Piscataway, NJ, USA, vol. 41, No. 12, Dec. 1, 2006 (Dec. 1, 2006), pp. 2860-2876, XP011150713, ISSN: 0018-9200, DOI:10.1109/JSSC.2006.884835.

Yoshinori Hirat A et al., "High-Frequency IIR Switched Capacitor Filter Using Parallel Cyclic-Type Circuit With Low-Power Consumption", Electronics & Communications in Japan, Part III—Fundamentalelectronic Science, Wiley, Hoboken, NJ, US, vol. 76, No. 7, Jul. 1, 1993 (Jul. 1, 1993), pp. 37-48, XP000442080, ISSN: 1042-0967.

* cited by examiner

DISCRETE TIME LOWPASS FILTER

BACKGROUND

I. Field

The present disclosure relates generally to electronics, and more specifically to a filter.

II. Background

In a wireless communication system, a transmitter may digitally process (e.g., encode and modulate) digital data to generate output samples. The transmitter may further condition (e.g., convert to analog, amplify, filter, and frequency upconvert) the output samples to generate a radio frequency (RF) modulated signal. The transmitter may then transmit the RF modulated signal via a wireless channel to a receiver.

The receiver may receive the transmitted RF signal and perform the complementary processing on the received RF signal. The receiver may condition (e.g., amplify, frequency downconvert, filter, and digitize) the received RF signal to obtain input samples. The receiver may further process (e.g., demodulate and decode) the input samples to recover the transmitted data.

The receiver may employ one or more analog lowpass filters to perform filtering. Each analog lowpass filter may be implemented with resistors and capacitors to obtain a desired filter transfer function. The resistors and capacitors may have high tolerances (especially when implemented on an integrated circuit), which may result in poor filter precision. Calibration circuits may be used to determine an RC time constant of the resistors and capacitors and to tune the resistors and/or capacitors to obtain the desired filter transfer function. The calibration circuits and extra resistors and/or capacitors to compensate for component tolerances would increase the die area of the analog lowpass filter and also increase calibration time of the receiver. Furthermore, the dynamic range of an analog-to-digital converter (ADC) in the receiver may need to be larger to account for residual component tolerance and to allow for the worst case filter attenuation. A lowpass filter that can avoid these shortcomings of the analog lowpass filter may be highly desirable.

DETAILED DESCRIPTION

The word "exemplary" is used herein to mean "serving as an example, instance, or illustration." Any design described herein as "exemplary" is not necessarily to be construed as preferred or advantageous over other designs.

A discrete time (DT) lowpass filter that may be used for various applications is described herein. A discrete time circuit (such as a DT lowpass filter) is a circuit that operates on analog samples instead of digital samples or a continuous time signal. An analog sample is an analog value for a discrete time instant. An analog sample may have any value whereas a digital sample may be restricted to certain quantized values. A continuous time signal is a signal that is continuously variable at all time instead of at discrete time instants.

The DT lowpass filter described herein may be used for wireless communication, computing, networking, consumer electronics, etc. The DT lowpass filter may also be used for various electronics devices such as wireless communication devices, cellular phones, broadcast receivers, personal digital assistants (PDAs), handheld devices, wireless modems, laptop computers, cordless phones, wireless local loop (WLL) stations, Bluetooth devices, consumer electronics devices, etc. For clarity, the use of the DT lowpass filter in a wireless communication device is described below.

Figure 1:
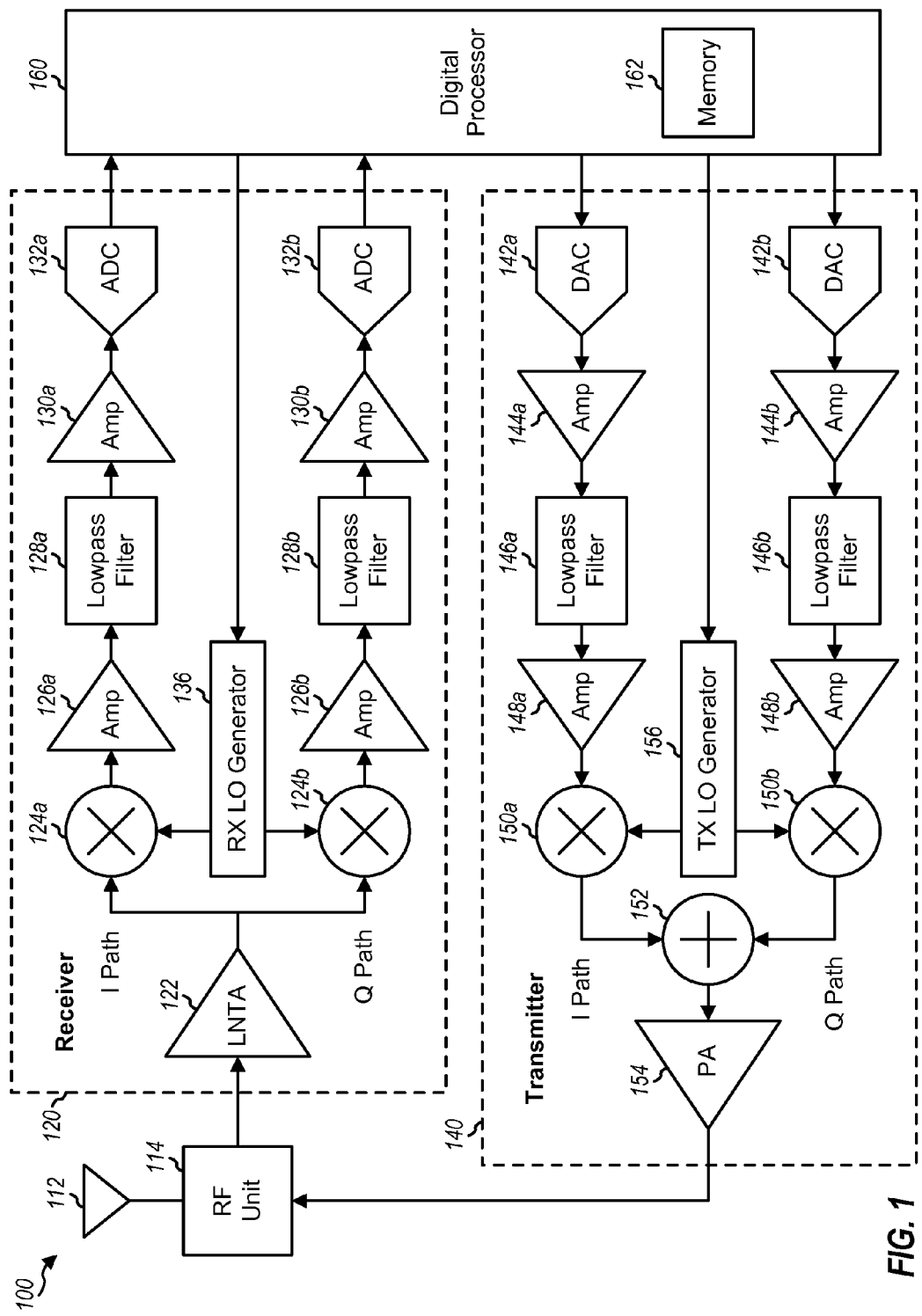
FIG. 1 shows a block diagram of a wireless communication device.

FIG. 1 shows a block diagram of an exemplary design of a wireless communication device 100, which may be a cellular phone or some other device. In the exemplary design shown in FIG. 1, wireless device 100 includes a receiver 120 and a transmitter 140 that support bi-directional communication. In general, wireless device 100 may include any number of receivers and any number of transmitters for any number of communication systems and any number of frequency bands.

In the receive path, an antenna 112 receives RF modulated signals transmitted by base stations and/or other transmitter stations and provides a received RF signal, which is routed through an RF unit 114 and provided to receiver 120. RF unit 114 may include an RF switch and/or a duplexer to multiplex RF signals for transmitter 140 and receiver 120. RF unit 114 may also include RF filters and/or other circuits. Within receiver 120, a low noise transconductance amplifier (LNTA) 122 amplifies the received RF signal (which may be a voltage signal) and provides an amplified RF signal (which may be a current signal). Mixers 124a and 124b downconvert the amplified RF signal from RF to baseband and provide inphase (I) and quadrature (Q) downconverted signals, respectively. A local oscillator (LO) generator 136 generates I and Q LO signals used for frequency downconversion and provides the I and Q LO signals to mixers 124a and 124b, respectively. The I and Q downconverted signals from mixers 124a and 124b are amplified by amplifiers (Amp) 126a and 126b, filtered by lowpass filters 128a and 128b, further amplified by amplifiers 130a and 130b, and digitized by ADCs 132a and 132b to obtain I and Q digital input samples, which are provided to a digital processor 160. The I and Q digital input samples may be processed (e.g., demodulated and decoded) by digital processor 160 to recover transmitted data.

In the transmit path, digital processor 160 processes data to be transmitted and provides I and Q digital output samples to transmitter 140. Within transmitter 140, the I and Q digital output samples are converted to analog by digital-to-analog converters (DACs) 142a and 142b, amplified by amplifiers 144a and 144b, filtered by lowpass filters 146a and 146b, and further amplified by amplifiers 148a and 148b to obtain I and Q baseband output signals. The I and Q baseband output signals are upconverted from baseband to RF by mixers 150a and 150b, summed by a summer 152, and amplified by a power amplifier (PA) 154 to obtain an output RF signal, which is routed through RF unit 114 and transmitted via antenna 112.

FIG. 1 shows exemplary designs of receiver 120 and transmitter 140 with a direct-conversion architecture, which frequency converts a signal between RF and baseband in one step. Receiver 120 and transmitter 140 may also be implemented with a super-heterodyne architecture that converts a signal between RF and baseband in multiple steps. In general, the conditioning of the signals in receiver 120 and transmitter 140 may be performed by one or more stages of amplifier, filter, mixer, etc. The circuit blocks may be arranged differently from the configuration shown in FIG. 1. Furthermore, other circuit blocks not shown in FIG. 1 may also be used to condition the signals in the transmitter and receiver. Some circuit blocks in FIG. 1 may also be omitted. All or a portion of receiver 120 and transmitter 140 may be implemented on one or more analog integrated circuits (ICs), RF ICs (RFICs), mixed-signal ICs, etc.

Digital processor 160 may include various processing units for data transmission and reception as well as other functions. Digital processor 160 may generate controls for various circuit blocks in receiver 120 and transmitter 140. Digital processor 160 may include a digital signal processor (DSP), a reduced instruction set computer (RISC) processor, a central processing unit (CPU), etc. A memory 162 may store program codes and data for wireless device 100 and may be internal to digital processor 160 (as shown in FIG. 1) or external to digital processor 160. Digital processor 160 may be implemented on one or more application specific integrated circuits (ASICs) and/or other ICs.

FIG. 1 shows various circuit blocks in receiver 120 and transmitter 140. In general, it is desirable to simplify the design of receiver 120 and transmitter 140 in order to reduce cost, size, power consumption, etc.

In an aspect, a DT lowpass filter may be used for any of the baseband lowpass filters 128 and 146 in receiver 120 and transmitter 140. The DT lowpass filter may have a filter transfer function that may be dependent mainly on sample rates and relative capacitor values. This may allow for realization of precise filter transfer functions without the need for calibration of time constants to account for component tolerances. Receiver 120 may support a range of signal bandwidth, e.g., from 200 KHz to 20 MHz. ADCs 132 may be sigma-delta ADCs, and the sampling rate of ADCs 132 may scale with the signal bandwidth in order to maintain a constant over sampling rate (OSR) for the sigma-delta ADCs. The sample rates for the DT lowpass filter may be fixed multiples of the sampling rate. The DT lowpass filter may then have a frequency response that scales with the signal bandwidth and may also have a constant signal-to-noise ratio (SNR) from switched capacitor circuits, both of which may be desirable. Furthermore, a discrete time signal from the DT lowpass filter may be processed directly by an ADC, without the need for re-sampling. The DT lowpass filter may also provide other advantages described below.

Figure 2:
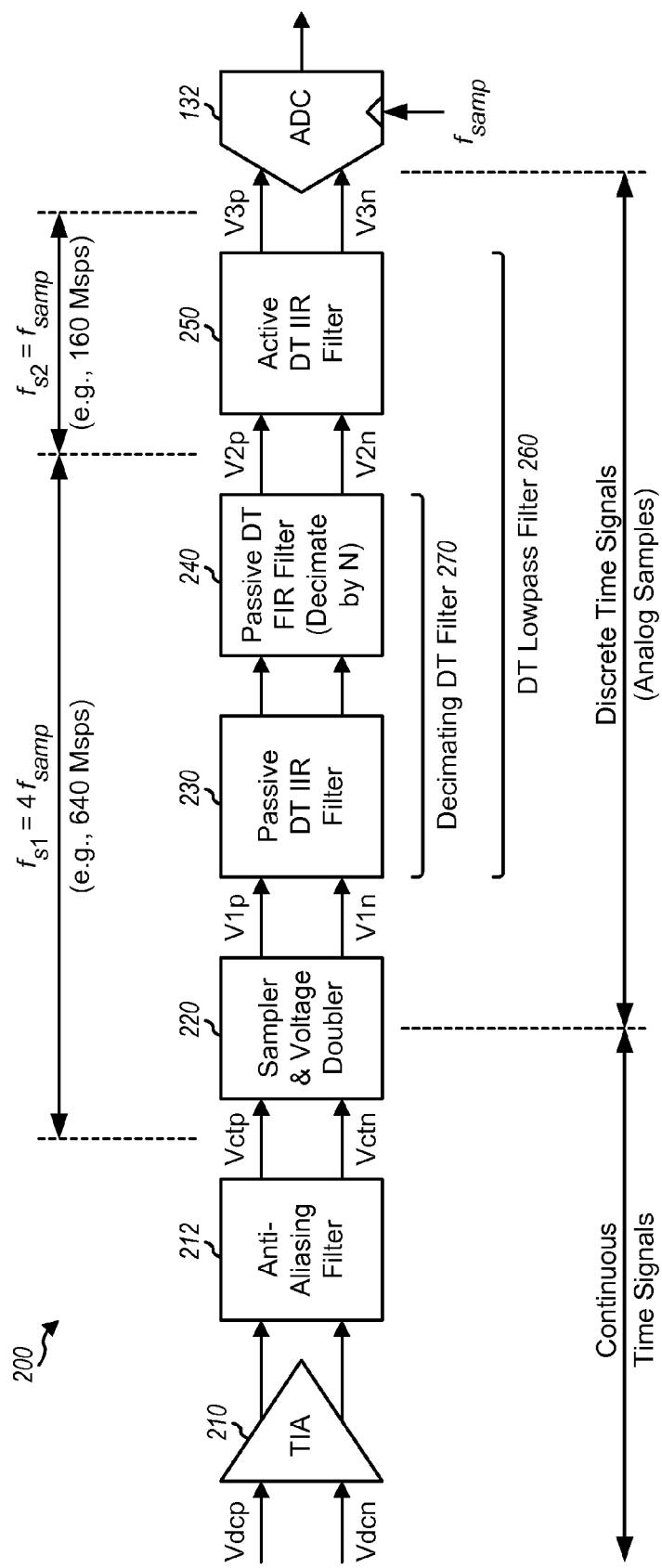
FIG. 2 shows a block diagram of one signal path in a receiver.

FIG. 2 shows a block diagram of an exemplary design of one receive signal path 200, which may be the I or Q path in receiver 120 in FIG. 1. FIG. 2 shows a differential design in which each circuit block receives a differential input signal and provides a differential output signal. Some or all of the circuit blocks may also be implemented with a single-ended design.

Within signal path 200, a trans-impedance amplifier (TIA) 210 amplifies a differential downconverted signal comprising Vdcp and Vdcn signals and provides a differential amplified signal. An anti-aliasing filter 212 filters the differential amplified signal and provides a differential filtered signal comprising Vctp and Vctn signals. TIA 210 and anti-aliasing filter 212 operate on continuous time signals.

A sampler 220 samples the differential continuous time signal from filter 212 and provides a first differential DT signal comprising V1p and V1n signals. In an exemplary design, sampler 220 further doubles the voltage of the DT signal relative to the voltage of the continuous time signal. A passive DT infinite impulse response (IIR) filter 230 and a passive DT finite impulse response (FIR) filter 240 filter the first differential DT signal from sampler 220 and provide a second differential DT signal comprising V2p and V2n signals. An active DT IIR filter 250 further filters the second differential DT signal, performs signal amplification and buffering, and provides a third differential DT signal comprising V3p and V3n signals to ADC 132. In general, a passive circuit is a circuit implemented with passive components (e.g., capacitors, switches, resistors, etc.) and does not include power amplification means. An active circuit is a circuit with amplification means (e.g., an amplifier). Each discrete time signal comprises a sequence of analog samples at a suitable sample rate. Passive DT IIR filter 230, passive DT FIR filter 240, and active DT IIR filter 250 may be part of a DT lowpass filter 260. Passive DT IIR filter 230 and passive DT FIR filter 240 may be part of a decimating DT filter 270.

TIA 210 may correspond to amplifier 126 in FIG. 1. Anti-aliasing filter 212, sampler 220, passive DT IIR filter 230, passive DT FIR filter 240, and active DT IIR filter 250 may correspond to lowpass filter 128 in FIG. 1. Active DT IIR filter 250 may also implement amplifier 130 in FIG. 1.

In an exemplary design, ADC 132 samples the third differential DT signal at a sampling rate of $f_{samp}$ and provides digital input samples. The ADC sampling rate may be dependent on the signal bandwidth and may be set to a fixed multiple (L) of the signal bandwidth. For example, L may be equal to eight, and the ADC sampling rate may be 40, 80 or 160 mega-samples/second (Msps) for signal bandwidth of 5, 10 or 20 MHz, respectively.

Sampler 220, passive DT IIR filter 230, and passive DT FIR filter 240 may operate at a first sample rate of $f_{s1}$, which may be a fixed multiple (N) of the ADC sampling rate. Active DT IIR filter 250 may operate at a second sample rate of $f_{s2}$, which may be equal to the ADC sampling rate. Active DT IIR filter 250 may also operate at a fraction of the received frequency, and its sample rate may vary according to a received channel. The ADC sampling rate may be equal to a baseband clock rate. Passive DT FIR filter 240 may perform decimation by N from the first sample rate to the second sample rate. For example, N may be equal to four, the ADC sampling rate may be 160 Msps, the first sample rate may be 640 Msps, and passive DT FIR filter 240 may perform decimation by four. Other sampling rates may also be used for ADC 132, and other sample rates may also be used for the discrete time circuit blocks in signal path 200. The control signals for sampler 220, DT IIR filter 230, and DT FIR filter 240 may be generated based on a first clock at the first sample rate $f_{s1}$. The control signals for DT IIR filter 250 may be generated based on a second clock at the second sample rate $f_{s2}$.

TIA 210 converts a current signal from a preceding stage (e.g., mixer 124) to a voltage signal for a subsequent stage. The use of TIA 210 (instead of a current amplifier) may provide several advantages. First, TIA 210 has low input impedance, which may result in lower voltage and greater linearity for preceding circuit blocks (e.g., mixer 124 and LNTA 122). Second, TIA 210 may provide voltage amplification to suppress the relative noise contribution of the following stages. Third, TIA 210 may have at least one continuous time pole that may aid in anti-alias filtering.

Anti-aliasing filter 212 performs filtering to attenuate undesired signal components and noise that may fold inband due to sampling by sampler 220. Anti-aliasing filter 212 may be implemented with an RC lowpass filter having one or more poles. The number of poles and the location of the poles may be selected to provide the desired amount of attenuation. In an exemplary design, anti-aliasing filter 212 may include a pair of poles located at around $f_{s1}/8$ to provide about 40 decibels (dB) of attenuation at $f_{s1}$. Anti-aliasing filter 212 may also be implemented in other manners and may also be incorporated in TIA 210.

Sampler 220 samples the continuous time signal from filter 212 and may also double the voltage of the continuous time signal provided by anti-aliasing filter 212. Doubling the voltage may reduce noise contribution of the following stages by about 6 dB. The relatively low output impedance of TIA 210 may be exploited to charge large capacitors within sampler 220. This may allow sampler 220 to drive capacitors in DT IIR filter 230 and DT FIR filter 240 with lower insertion loss. The output impedance of TIA 210 should be sufficiently large to provide adequate voltage gain to suppress the relative noise of the following stages.

Figure 3:
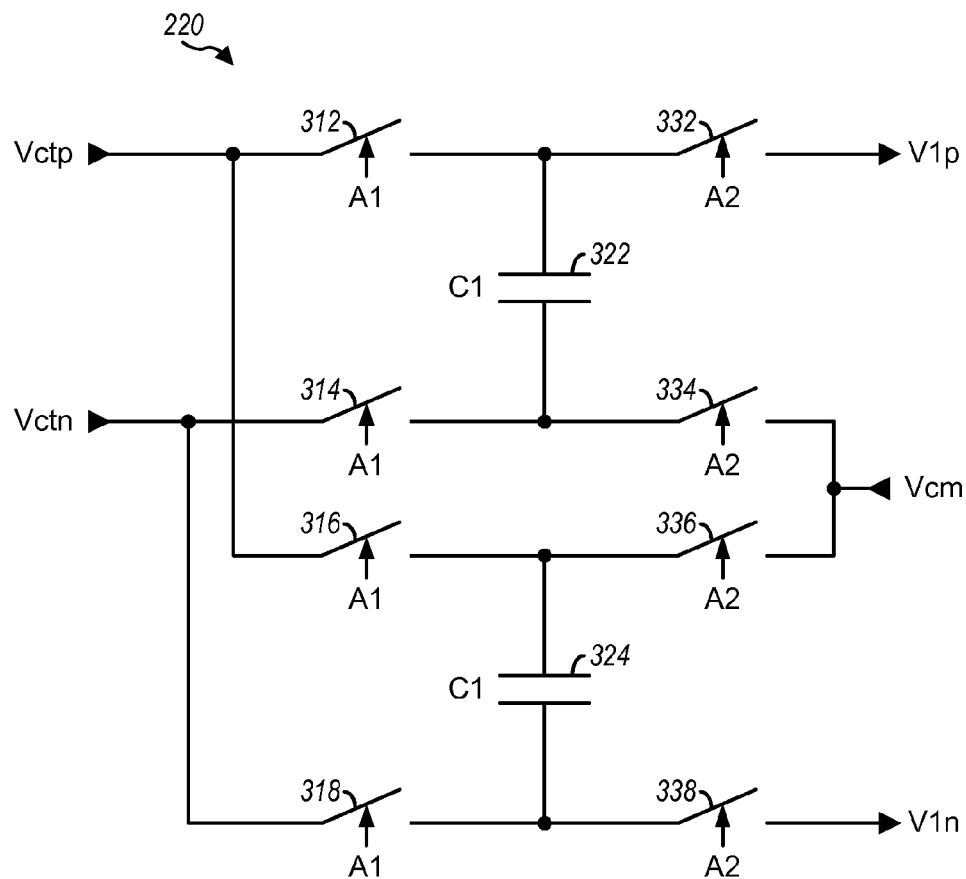
FIG. 3 shows a schematic diagram of a sampler and voltage doubler.

FIG. 3 shows a schematic diagram of an exemplary design of sampler 220 in FIG. 2. Within sampler 220, a switch 312 has one end receiving the Vctp signal and the other end coupled to the top plate of a capacitor 322. A switch 314 has one end receiving the Vctn signal and the other end coupled to the bottom plate of capacitor 322. Similarly, switches 316 and 318 have one end receiving the Vctp and Vctn signals, respectively, and the other end coupled to the top and bottom plates, respectively, of a capacitor 324. A switch 332 has one end coupled to the top plate of capacitor 322 and the other end providing the V1p signal. A switch 338 has one end coupled to the bottom plate of capacitor 324 and the other end providing the V1n signal. A switch 334 has one end coupled to the bottom plate of capacitor 322 and the other end coupled to a common mode voltage, Vcm. A switch 336 has one end coupled to the top plate of capacitor 324 and the other end coupled to the Vcm voltage. Switches 312 to 318 and switches 332 to 338 may be implemented with metal oxide semiconductor (MOS) transistors and/or other types of transistors. Switches 312 to 318 are controlled by an A1 control signal, and switches 332 to 338 are controlled by an A2 control signal.

Figure 4:
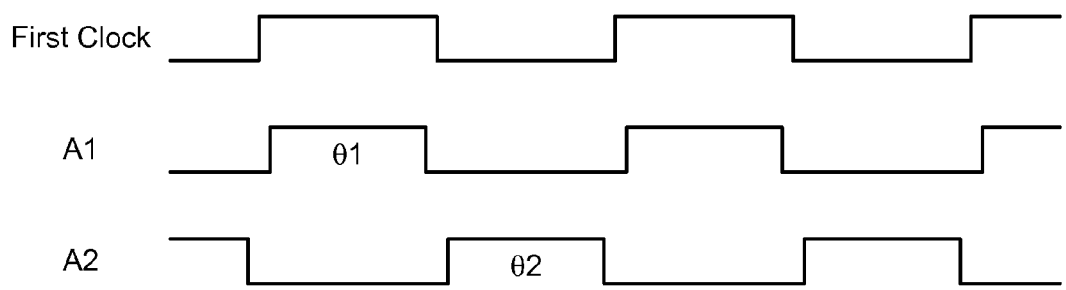
FIG. 4 shows a timing diagram of control signals for the sampler.

FIG. 4 shows a timing diagram of an exemplary design of the A1 and A2 signals for sampler 220 in FIG. 3. The A1 signal may be active at logic high for a portion of each cycle of the first clock, and the A2 signal may be active for another portion of each first clock cycle. The active portions of the A1 and A2 signals do not overlap. FIG. 4 shows an exemplary design in which the duty cycle is about 50%, and the active portion of the A1 signal is approximately equal to the active portion of the A2 signal. The duty cycle may also be larger or smaller than 50%, and the active portion of the A1 signal may be larger or smaller than the active portion of the A2 signal.

Sampler 220 operates as follows. During a first phase θ1 of the first clock, the A1 signal is enabled, switches 312 to 318 are closed, and switches 332 to 338 are opened. The Vctp and Vctn signals charge the top and bottom plates of both capacitors 322 and 324. During a second phase θ2 of the first clock, the A2 signal is enabled, switches 332 to 338 are closed, and switches 312 to 318 are opened. The bottom plate of capacitor 322 and the top plate of capacitor 324 are both coupled to the Vcm voltage. The top plate of capacitor 322 provides the V1p signal, and the bottom plate of capacitor 324 provides the V1n signal.

Sampler 220 samples the voltage signal from TIA 210 differentially onto capacitors 322 and 324 during the first phase, and the voltage across each capacitor may be ΔV. During the second phase, voltage doubling is achieved by connecting one plate of capacitor 322 and one plate of capacitor 324 to the common mode voltage. Capacitors 322 and 324 are thus coupled in series and provide a differential voltage of 2ΔV and a common mode voltage of Vcm. Hence, voltage doubling and common mode conversion are achieved in one step.

Capacitor 322 has a capacitance of C1, and capacitor 324 also has a capacitance of C1. During the first phase, capacitors 322 and 324 are coupled in parallel, and the total input capacitance is 2C1. During the second phase, capacitors 322 and 324 are coupled in series, and the total output capacitance is C1/2. Sampler 220 thus doubles the output voltage while reducing the output capacitance by a factor of four.

In general, sampler 220 may increase the output voltage by a factor of K, where K≥1. The output capacitance may be decreased by a factor of $K^2$, e.g., by a factor of four for voltage doubling, by a factor of 16 for voltage quadrupling, etc. Larger output capacitance may be desirable in order to reduce insertion loss. The amount of boost in voltage (K) may be selected based on a tradeoff between various factors such as noise reduction, insertion loss, etc.

Figure 5:
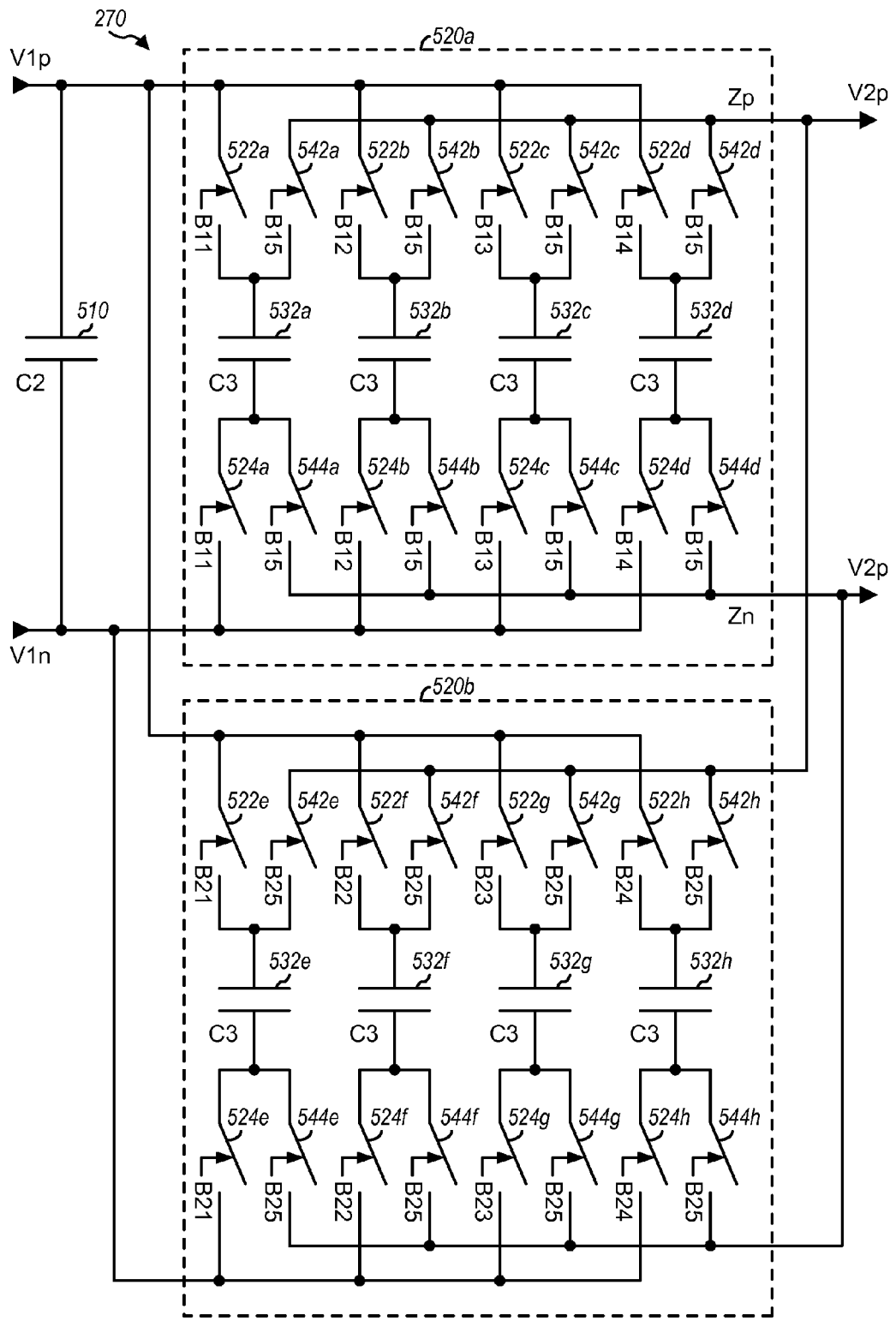
FIG. 5 shows a schematic diagram of a decimating discrete time (DT) filter.

FIG. 5 shows a schematic diagram of an exemplary design of decimating DT filter 270 in FIG. 2. Decimating DT filter 270 incorporates both passive DT IIR filter 230 and passive DT FIR filter 240 in FIG. 2. In the exemplary design shown in FIG. 5, decimating DT filter 270 includes an input capacitor 510 and two identical filter banks 520a and 520b, which are controlled by different sets of control signals. Capacitor 510 has its top plate receiving the V1p signal and its bottom plate receiving the V1n signal.

Within filter bank 520a, switches 522a, 522b, 522c and 522d have one end coupled to the top plate of capacitor 510 and the other end coupled to the top plate of capacitors 532a, 532b, 532c and 532d, respectively. Switches 524a, 524b, 524c and 524d have one end coupled to the bottom plate of capacitor 510 and the other end coupled to the bottom plate of capacitors 532a, 532b, 532c and 532d, respectively. Switches 542a, 542b, 542c and 542d have one end coupled to the top plate of capacitors 532a, 532b, 532c and 532d, respectively, and the other end coupled to output node Zp. Switches 544a, 544b, 544c and 544d have one end coupled to the bottom plate of capacitors 532a, 532b, 532c and 532d, respectively, and the other end coupled to output node Zn. Nodes Zp and Zn provide the V2p and V2n signals, respectively. Switches 522a, 522b, 522c and 522d and switches 524a, 524b, 524c and 524d are controlled by B11, B12, B13 and B14 control signals, respectively. Switches 542a to 542d and switches 544a to 544d are controlled by a B15 control signal.

Within filter bank 520b, capacitors 532e, 532f, 532g and 532h and switches 522e to 522h, 524e to 524h, 542e to 542h, and 544e to 544h are coupled in similar manner as the corresponding capacitors and switches in filter bank 520a. Switches 522e, 522f, 522g and 522h and switches 524e, 524f, 524g and 524h are controlled by B21, B22, B23 and B24 control signals, respectively. Switches 542e to 542h and switches 544e to 544h are controlled by a B25 control signal.

FIG. 5 shows an exemplary design in which decimating DT filter 270 performs decimation by four, and each filter bank 520 includes four capacitors 532. In general, decimating DT filter 270 may perform decimation by N, and each filter bank 520 may include N capacitors. For clarity, much of the description below assumes decimation by four.

Figure 6:
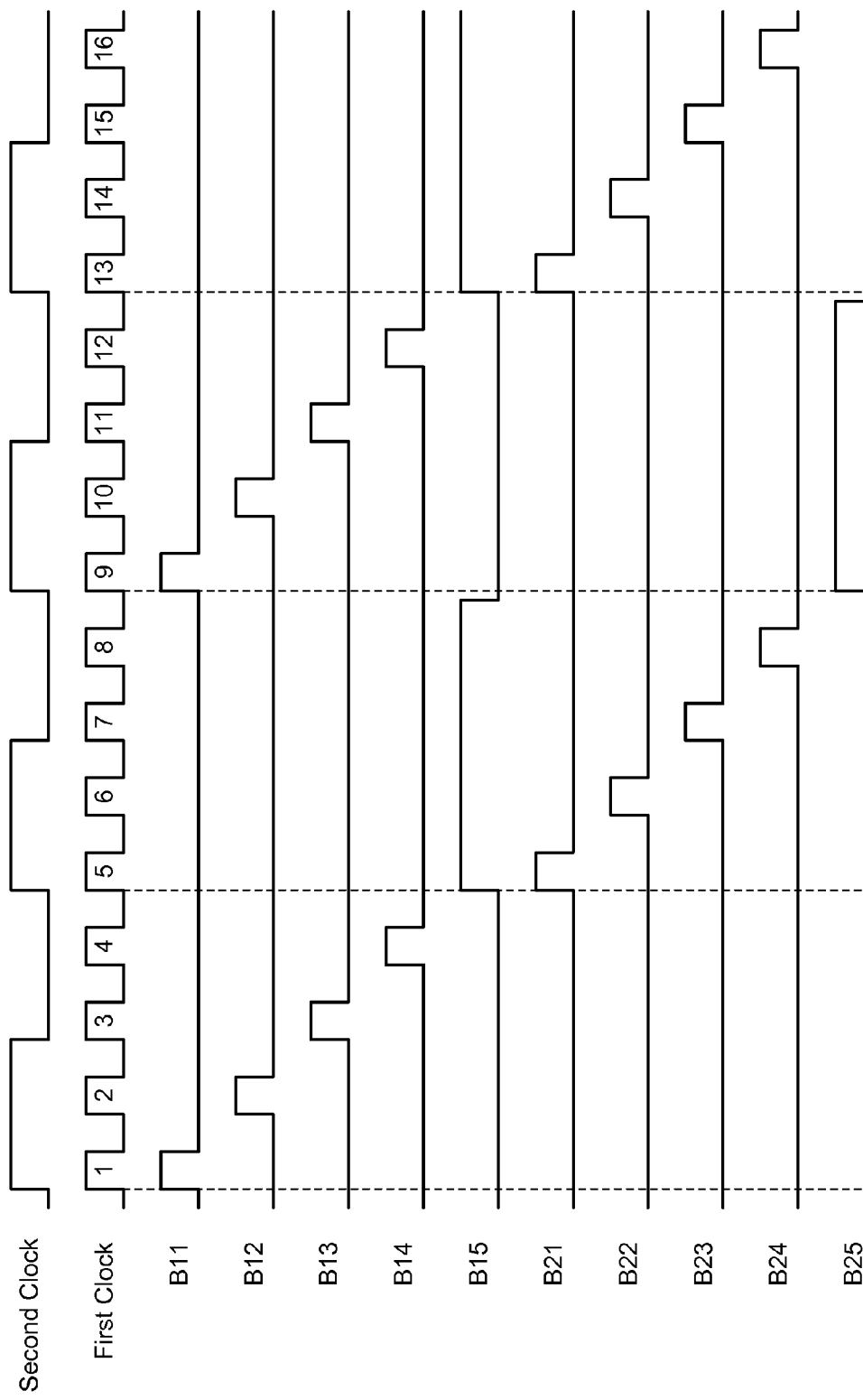
FIG. 6 shows a timing diagram of control signals for the decimating DT filter.

FIG. 6 shows a timing diagram of an exemplary design of the control signals for decimating DT filter 270 in FIG. 3. The first clock is four times the rate of the second clock, and each cycle of the second clock spans four cycles of the first clock. The B11 to B14 signals and the B21 to B24 signals may each be active for a fraction of one cycle in every eight cycles of the first clock. The B11 to B14 signals and the B21 to B24 signals may be staggered and may be active in different cycles of the first clock, as shown in FIG. 6. The B15 signal may be active when the B11 to B14 signals are not active and may be non-overlapping with the B11 signal. The B25 signal may be active when the B21 to B24 signals are not active and may be non-overlapping with the B21 signal.

Decimating DT filter 270 operates as follows. Within filter bank 520a, capacitors 532a, 532b, 532c and 532d are charged in four consecutive cycles of the first clock and store four analog samples for the V1p and V1n signals. Thereafter, the charge on capacitors 532a, 532b, 532c and 532d is summed at output nodes Zp and Zn, and the summed charge is provided to the V2p and V2n signals. The summing of the charge from four capacitors 532a to 532d effectively implements a 4-tap FIR filter with decimation by four. The coefficients of the FIR filter may be [1, 1, 1, 1] if capacitors 532a, 532b, 532c and 532d have equal sizes but may also have other values. Capacitor 510 is charged by capacitors 322 and 324 in sampler 220 in each cycle of the first clock. Capacitor 510 provides its charge to one of four capacitors 532a to 532d in each cycle of the first clock. Capacitor 510 has a capacitance of C2, and each capacitor 532 has a capacitance of C3. An IIR filter is effectively implemented by the loss of charge sharing from capacitor 510 to capacitors 532.

Filter banks 520a and 520b operate in an interleaved manner. Capacitor 510 charges the four capacitors 532a to 532d in filter bank 520a in four cycles, then charges the four capacitors 532e to 532h in filter bank 520b in the next four cycles, then charges the four capacitors 532a to 532d in filter bank 520a in the next four cycles, etc. The charge in capacitors 532a to 532d in filter bank 520a is summed and provided to the V2p and V2n signals while capacitors 532e to 532h in filter bank 520b are charged, and vice versa.

Decimating DT filter 270 includes an IIR pole formed between capacitor 510 and capacitors 532. The location of the IIR pole may be expressed as:

$$f_{pole} = \frac{C3}{C2} \cdot f_{clk1} = N \cdot \frac{C3}{C2} \cdot f_{clk2} \text{ (radians/second)}. \quad \text{Eq (1)}$$

In an exemplary design, the IIR pole may be located within the signal bandwidth (or $f_{pole} < f_{BW}$) in order to provide more adjacent channel filtering, which may be more important for some applications. For example, the IIR pole may be placed at approximately $f_{BW}/2$, which may be about 4 MHz in one exemplary design. Placing the IIR pole within the signal bandwidth results in inband droop. This inband droop may be compensated for by active DT IIR filter 250, as described below.

Capacitors 532 are replenished with the charge from capacitors 322 and 324 in sampler 220 at a rate of $f_{s1}$. The discharging of capacitors 532 at this rate result in a charge sharing loss, which may be expressed as:

$$\text{Loss} = 20 \log_{10}\left(\frac{C1 + C3}{C2}\right). \quad \text{Eq (2)}$$

The loss in equation (2) is given in units of dB. As shown in equation (2), a larger C1 capacitance and/or a smaller C3 capacitance would result in lower loss.

Figure 7:
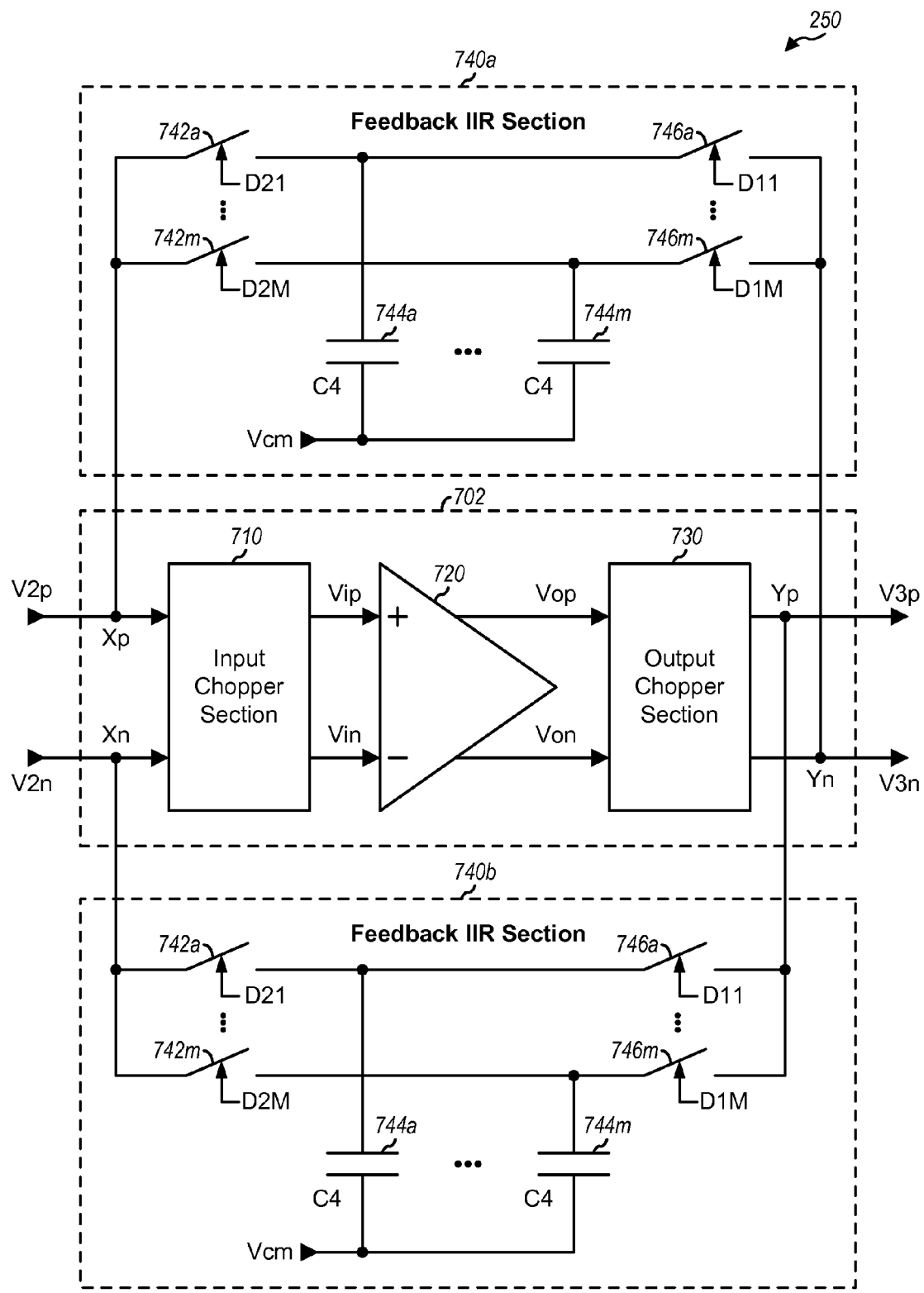
FIG. 7 shows a schematic diagram of an active DT filter.

FIG. 7 shows a schematic diagram of an exemplary design of active DT IIR filter 250 in FIG. 2. In the exemplary design shown in FIG. 7, active DT IIR filter 250 includes a chopped switched capacitor amplifier 702 and feedback IIR sections 740a and 740b. Chopped switched capacitor amplifier 702 includes an input chopper section 710, an amplifier 720, and an output chopper section 730.

Input chopper section 710 has its differential input coupled to nodes Xp and Xn and its differential output coupled to input nodes Vip and Vin of amplifier 720. Nodes Xp and Xn receive the V2p and V2n signals, respectively. Output chopper section 730 has its differential input coupled to output nodes Vop and Von of amplifier 720 and its differential output coupled to nodes Yp and Yn, which provide the V3p and V3n signals. Feedback IIR section 740a has its input coupled to node Yn and its output coupled to node Xp. Feedback IIR section 740b has its input coupled to node Yp and its output coupled to node Xn. Feedback IIR sections 740a and 740b are thus coupled with negative feedback.

Within feedback IIR section 740a, M switches 742a to 742m have one end coupled to node Xp and the other end coupled to the top plate of M capacitors 744a to 744m, respectively, where M>1. The bottom plates of capacitors 744a to 744m are coupled to the Vcm voltage. M switches 746a to 746m have one end coupled to the top plate of capacitors 744a to 744m, respectively, and the other end coupled to node Yn. Within feedback IIR section 740b, switches 742 and 746 and capacitors 744 are coupled in similar manner as the corresponding switches and capacitors in feedback IIR section 740a. Switches 742a to 742m in each feedback IIR section 740 are controlled by D21 to D2M control signals, respectively. Switches 746a to 746m in each feedback IIR section 740 are controlled by D11 to D1M control signals, respectively. Each capacitor 744 has a capacitance of C4.

FIG. 7 shows an exemplary design in which two sets of capacitors 744 are used in two feedback IIR sections 740a and 740b, with each capacitor 744 having one end coupled to the Vcm voltage. In another exemplary design, a single set of capacitors 744 may be used for both feedback IIR sections 740a and 740b. Each capacitor 744 may be coupled differentially and may have (i) its top end coupled to a pair of switches 742 and 746 in feedback IIR section 740a and (ii) its bottom end coupled to a pair of switches 742 and 746 in feedback IIR section 740b. This exemplary design may reduce the number of capacitors by one half. Furthermore, each differentially connected capacitor may have one half the capacitance of one capacitor 744 in FIG. 7. The M differentially connected capacitors may be implemented in about one quarter of the die area used to implement the 2M capacitors 744 in FIG. 7.

FIG. 7 shows an exemplary design in which feedback IIR sections 740*a* and 740*b* are connected to the output of chopping section 730. This exemplary design may allow the amplifier common mode voltages to be reset independently of the switch timing. However, there may be some loss, and the noise of output chopper section 730 may be fed back to the amplifier inputs. In another exemplary design, feedback IIR sections 740*a* and 740*b* may be coupled to the output of amplifier 720.

Figure 8:
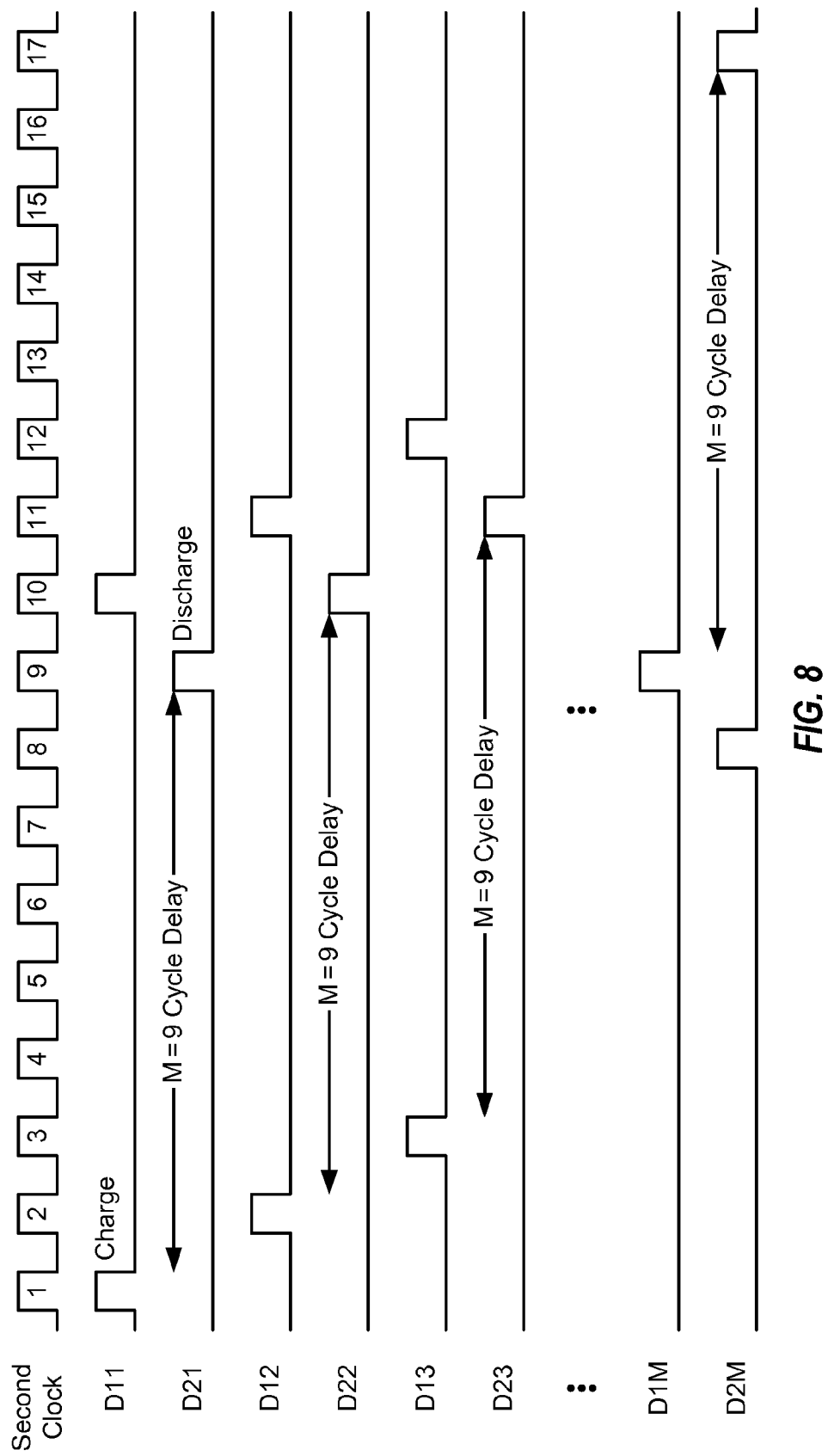
FIG. 8 shows a timing diagram of control signals for the active DT filter.

FIG. 8 shows a timing diagram of an exemplary design of the control signals for feedback IIR sections 740*a* and 740*b* in FIG. 7. The D11 to D1M signals and the D21 to D2M signals may each be active for a fraction of one cycle in every M cycles of the second clock. For clarity, FIG. 8 shows a case in which M=9. The D11 to D1M signals may be staggered and may be active in different cycles of the second clock, as shown in FIG. 8. The D21 to D2M signals may also be staggered and may be active in different cycles of the second clock, as also shown in FIG. 8. The D2*m* signal may be delayed by M cycles of the second clock from the corresponding D1*m* signal, where m ∈ {1, . . . , M}.

Feedback IIR section 740*a* operates as follows. Capacitor 744*a* is charged by the V3*n* signal via switch 746*a* during one cycle of the second clock when the D11 signal is active. Capacitor 744*a* provides its charge to the Xp node via switch 742*a* M clock cycles later when the D21 signal is active. Each remaining capacitor 744 is charged by the V3*n* signal via a respective switch 746 during one clock cycle when its D1*m* signal is active. Each capacitor 744 provides its charge to the Xp node via a respective switch 742 M clock cycles later when its D2*m* signal is active. Capacitors 744*a* to 744*m* are charged by the V3*n* signal in M consecutive clock cycles. Capacitors 744*a* to 744*m* provide their charge, after a delay of M clock cycles, to the Xp node in M consecutive clock cycles. Capacitors 744*a* to 744*m* in feedback IIR section 740*b* are charged by the V3*p* signal and provide their charge to node Xn in similar manner.

Active DT IIR filter 250 is formed by sampling the output of amplifier 702 with capacitors 744, delaying the analog samples for M clock cycles, and then combining the delayed analog samples at nodes Xp and Xn with the analog samples from capacitors 532 in the preceding stage. Active DT IIR filter 250 has a single pole, which may be expressed in the z-domain as:

$$H(z) = \frac{1}{1 + az^{-M}}, \text{ where} \quad \text{Eq (3)}$$

$$a \approx \frac{G \cdot C4}{N \cdot C3} \text{ is an IIR coefficient,} \quad \text{Eq (4)}$$

G is the gain of amplifier 720, and
N·C3 is the total output capacitance of passive DT FIR filter 240, with N=4 in FIG. 5

Active DT IIR filter 250 has a gain of 1/(1+a) when $z^{-M}=1$, which occurs at DC. Active DT IIR filter 250 has a gain of 1/(1−a) when $z^{-M}=-1$, which occurs at the band edge of ($f_{clk2}/2$)*(1/M) (e.g., 8.9 MHz). The IIR coefficient may be selected to obtain the desired frequency response (e.g., the desired peaking) for active DT IIR filter 250.

Active DT IIR filter 250 can provide peaking in the passband, which may be used to equalize the inband droop of passive DT IIR filter 230. The overall frequency response of DT IIR filters 230 and 250 should provide the desired passband response as well as the desired adjacent channel rejection. DT IIR filters 230 and 250 can be operated with clocks that track the ADC sampling rate. Hence, the frequency responses of DT IIR filters 230 and 250 would scale with the ADC sampling rate.

Figure 9:
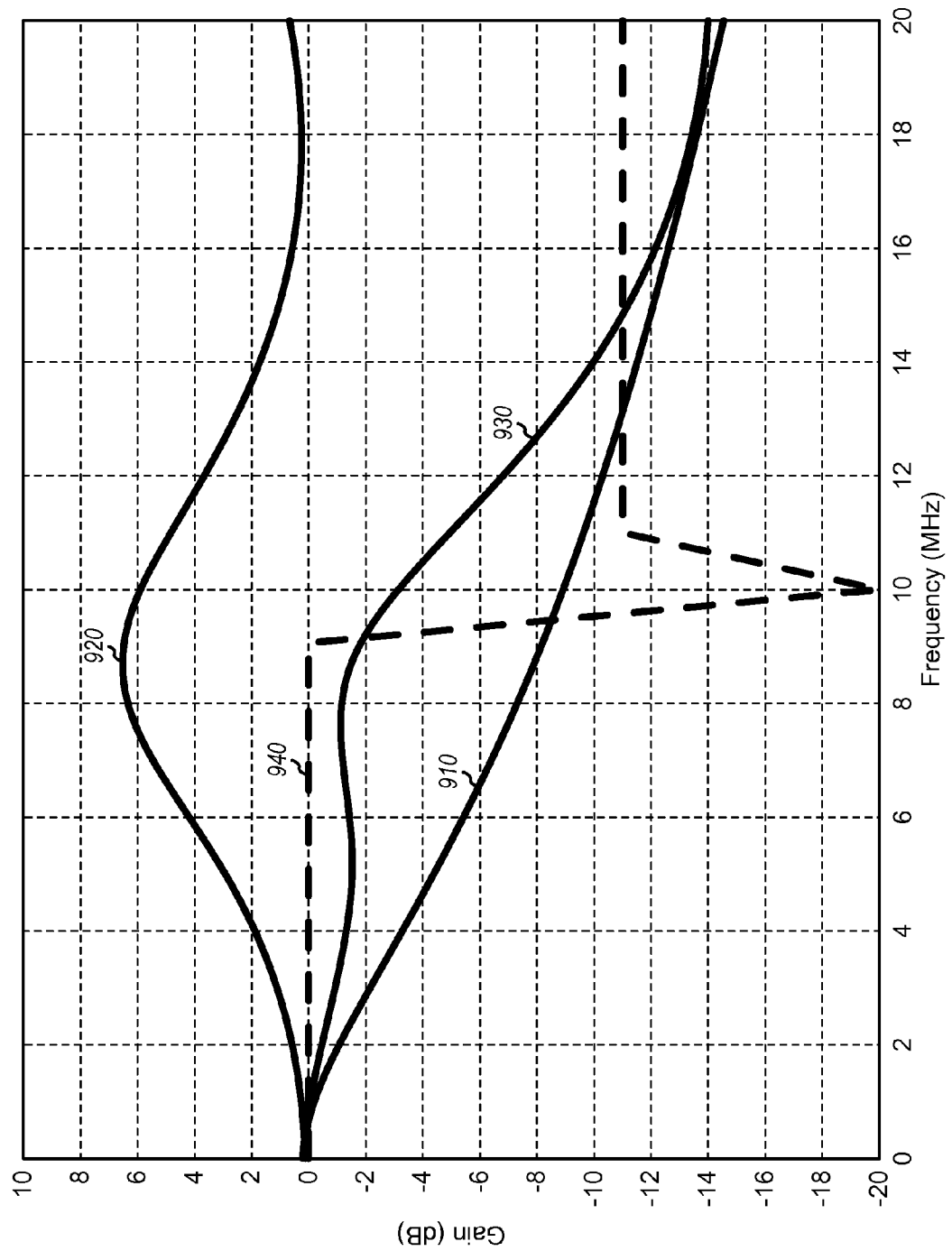
FIG. 9 shows plots of the frequency responses of several DT filters.

FIG. 9 shows plots of the frequency responses of DT IIR filters 230 and 250 for an exemplary design in which $f_{s1}$=640 Msps, $f_{s2}$=160 Msps, N=4, and M=9. Passive DT IIR filter 230 has a pole at approximately 4 MHz, and the filter band edge is approximately 9 MHz. The frequency response of passive IR filter 230 is shown by a plot 910 and has inband droop due to its pole being located below the band edge. The frequency response of active DT IIR filter 250 is shown by a plot 920 and has peaking in the passband. The overall frequency response of DT IIR filters 230 and 250 is shown by a plot 930 and has relatively flat passband and sharper attenuation. The overall frequency response may be designed to resemble the frequency response of a third-order Butterworth filter or some other filter. A plot 940 shows a target response with adjacent channel rejection of approximately 11 dB.

The peak in the frequency response of DT IIR filter 250 may be moved lower with a larger delay in feedback IIR sections 740, which may be achieved with more capacitors 744. The decimation by N by DT FIR filter 240 allows DT IIR filter 250 to operate with a slower second clock. This allows a given delay to be achieved with fewer capacitors 744, which may be desirable. For example, if decimation by N was omitted, then DT IIR filter 250 would operate at the first sample rate $f_{s1}$ (instead of $f_{s2}$), and the same frequency response for DT IIR filter 250 can be obtained with N*M capacitors 744 (instead of M capacitors 744). Thus, decimation by N reduces the number of required capacitors by a factor of N.

Referring back to FIG. 7, chopped switched capacitor amplifier 702 may be used to reduce 1/f flicker noise, provide good noise performance, and also provide a low input capacitance that can support overall signal gain. Amplifier 702 may also be implemented with a switched capacitor amplifier or some other type of amplifier.

Figure 10:
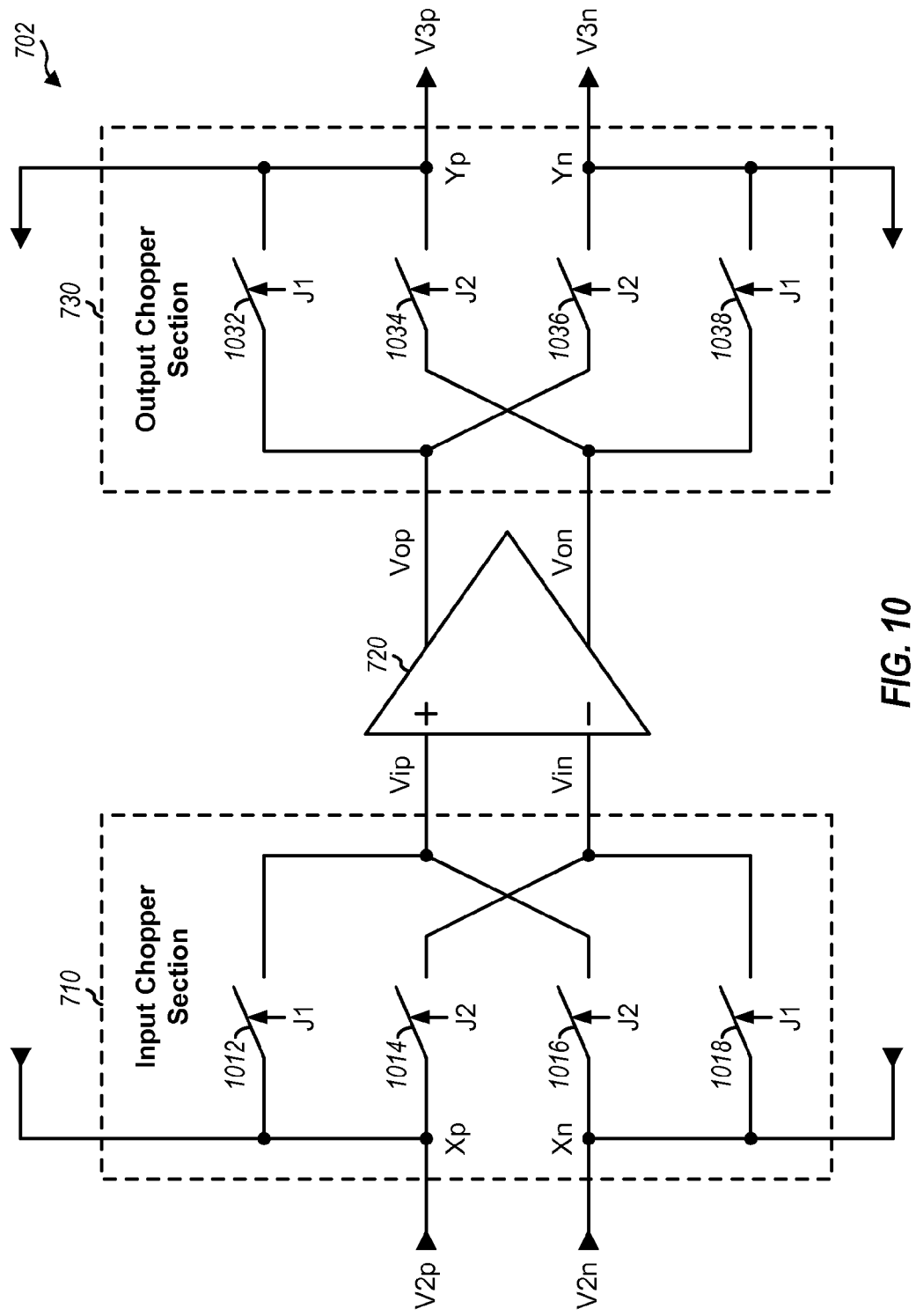
FIG. 10 shows a schematic diagram of a chopped switched capacitor amplifier.

FIG. 10 shows a schematic diagram of an exemplary design of chopped switched capacitor amplifier 702 in FIG. 7. Within input chopper section 710, a switch 1012 is coupled between nodes Xp and Vip, a switch 1014 is coupled between nodes Xp and Vin, a switch 1016 is coupled between nodes Xn and Vip, and a switch 1018 is coupled between nodes Xn and Vin. Switches 1012 and 1018 are controlled by a J1 control signal, which may be equal to a chopping clock. Switches 1014 and 1016 are controlled by a J2 control signal, which may be equal to an inverted version of the chopping clock. The chopping clock may be at the second sample rate $f_{s2}$.

Within output chopper section 730, a switch 1032 is coupled between nodes Vop and Yp, a switch 1034 is coupled between nodes Von and Yp, a switch 1036 is coupled between nodes Vop and Yn, and a switch 1038 is coupled between nodes Von and Yn. Switches 1032 and 1038 are controlled by the J1 signal, and switches 1034 and 1036 are controlled by the J2 signal. Although not shown in FIG. 10 for simplicity, a set of switches may be used to reset the input common mode voltage of amplifier 720 between samples (e.g., when the J1 and J2 signals are simultaneously at logic low.

The input and output chopping operates as follows. Input chopper section 710 alternately provides the V2*p* signal to nodes Vip and Vin on alternate phases of the chopping clock and also alternately provides the V2n signal to nodes Vin and Vip on alternate phases of the chopping clock. This results in chopping of the input signal, which upconverts the desired signal component to the chopping clock frequency. The desired signal component is thus minimally affected by low frequency flicker noise of amplifier 720. Output chopper section 730 operates in similar manner as input chopper section 710. Output chopper section 730 alternately provides the signal at node Vop to nodes Yp and Yn on alternate phases of the chopping clock and also alternately provides the signal at node Von to nodes Yn and Yp on alternate phases of the chopping clock. This results in chopping of the output signal, which downconverts the desired signal component to baseband and moves the flicker noise to the chopping clock frequency. The chopping action by both the input and output chopping sections may downconvert noise and undesired signal components near the chopping clock frequency to baseband. TIA 210 and anti-aliasing filter 212 may attenuate the noise and undesired signal components near the chopping clock frequency prior to the chopping amplifier.

Figure 11:
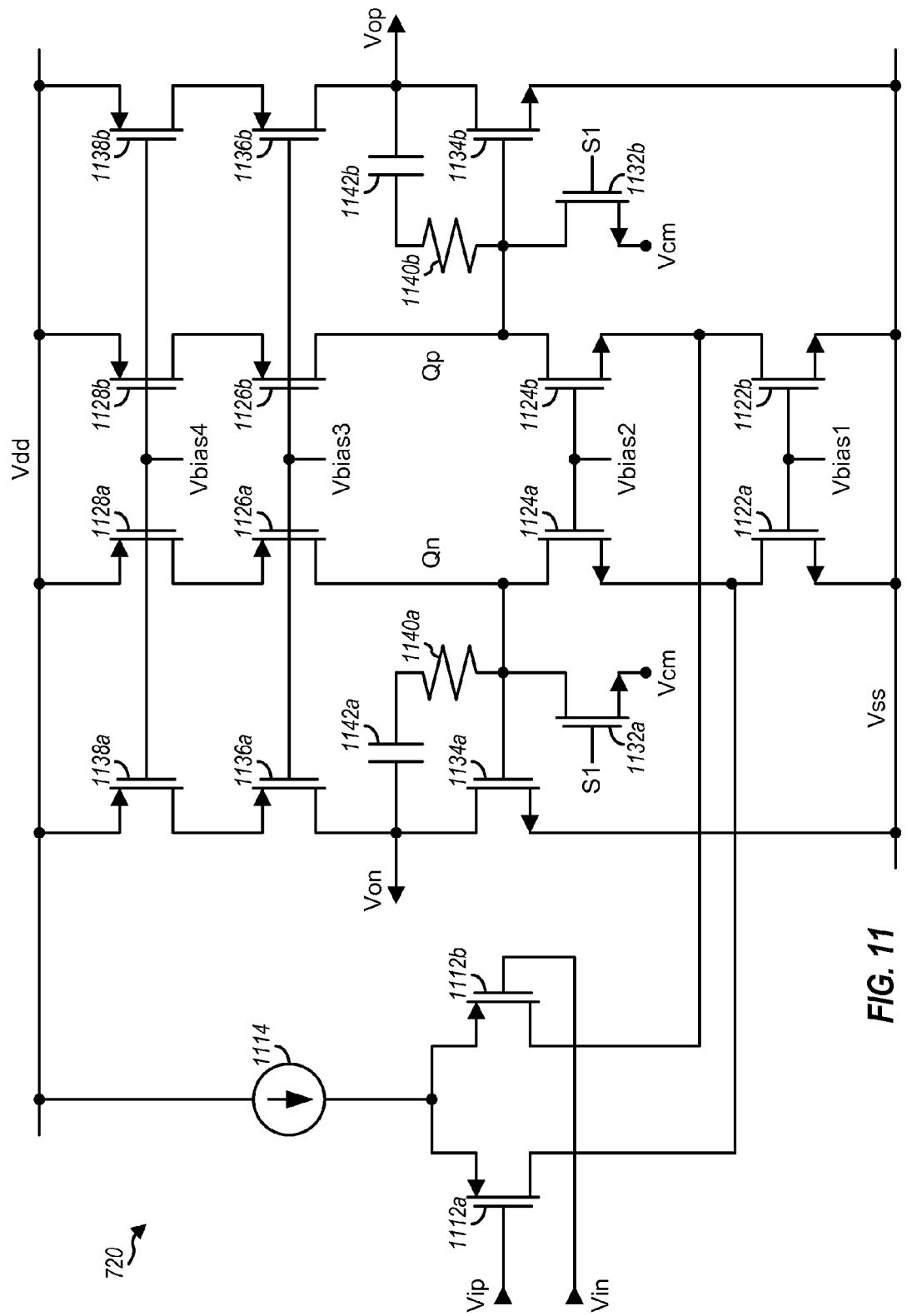
FIG. 11 shows a schematic diagram of a folded cascode amplifier.

FIG. 11 shows a schematic diagram of an exemplary design of amplifier 720 in FIG. 7. In this exemplary design, amplifier 720 is implemented with a 2-stage folded cascode amplifier. In the first stage, P-channel MOS (PMOS) transistors 1112a and 1112b have their sources coupled together and their gates coupled to nodes Vip and Vin, respectively. A current source 1114 is coupled between a Vdd power supply and the sources of PMOS transistors 1112. N-channel MOS (NMOS) transistors 1122a and 1122b have their gates receiving a Vbias1 voltage, their sources coupled to circuit ground, Vss, and their drains coupled to the drains of PMOS transistors 1112a and 1112b, respectively. NMOS transistors 1124a and 1124b have their gates receiving a Vbias2 voltage, their sources coupled to the drains of NMOS transistors 1122a and 1122b, respectively, and their drains coupled to nodes Qn and Qp, respectively. PMOS transistors 1126a and 1126b have their gates receiving a Vbias3 voltage and their drains coupled to nodes Qn and Qp, respectively. PMOS transistors 1128a and 1128b have their gates receiving a Vbias4 voltage, their drains coupled to the sources of PMOS transistors 1126a and 1126b, respectively, and their sources coupled to the Vdd supply.

In the second stage, NMOS transistors 1132a and 1132b have their gates receiving an S1 control signal, their sources coupled to the Vcm voltage, and their drains coupled to nodes Qn and Qp, respectively. NMOS transistors 1134a and 1134b have their gates coupled to nodes Qn and Qp, respectively, their sources coupled to circuit ground, and their drains coupled to nodes Von and Vop, respectively. PMOS transistors 1136a and 1136b have their gates receiving the Vbias3 voltage and their drains coupled to nodes Von and Vop, respectively. PMOS transistors 1138a and 1138b have their gates receiving the Vbias4 voltage, their sources coupled to the Vdd supply, and their drains coupled to the sources of PMOS transistors 1136a and 1136b, respectively. A resistor 1140a and a capacitor 1142a are coupled in series and between the gate and drain of NMOS transistor 1134a. A resistor 1140b and a capacitor 1142b are coupled in series and between the gate and drain of NMOS transistor 1134b. Resistors 1140 and capacitors 1142 provide compensation and ensure stability.

The folded cascode amplifier in FIG. 11 may provide various advantages. The input differential pair comprising PMOS transistors 1112a and 1112b may improve the linearity of the first stage by allowing for a low input common mode voltage (e.g., about 300 mV with a Vdd voltage of about 1.3 Volts). The folded cascode structure of the first stage may provide high gain for the first stage and improve the dynamic range of the input differential pair. The second stage may be operated with an output common mode voltage of Vcm via NMOS transistors 1132a and 1132b, which may improve the linearity of this stage. Furthermore, the extra gain provided by the second stage may reduce the voltage swing of the first stage.

In an exemplary design, the output signal swing from amplifier 720 may be monitored. An additional output stage (not shown in FIG. 11) may be enabled when the signal swing exceeds a particular threshold. The additional output stage may be coupled in parallel with the second stage, may have its inputs coupled to nodes Qp and Qn, and may have its outputs coupled to Vop and Von.

The DT lowpass filter described herein may provide various advantages. The DT lowpass filter may have a frequency response that scales with signal bandwidth and may also have a constant SNR from switched capacitor circuits. Furthermore, the discrete time signal from the DT lowpass filter may be processed directly by an ADC. The DT lowpass filter can exploit improved device physics of next generation IC process technology (e.g., reduced "on" resistance and parasitic capacitance). The DT lowpass filter can operate with a lower supply voltage, which may be prevalent as IC process technology improves and transistor size shrinks. In contrast, a continuous time lowpass filter may require a higher supply voltage in order to meet dynamic range, SNR, and/or other requirements. The DT lowpass filter may have better unit to unit repeatability than a continuous time lowpass filter relying on R, C and gm. The DT lowpass filter may be less susceptible to variations in IC process, temperature, and supply voltage. The DT lowpass filter may provide performance advantages (e.g., better I/Q matching and lower power consumption) for processing wide bandwidth signals.

In an exemplary design, an apparatus may comprise a decimating DT filter and an active DT filter, e.g., as shown in FIG. 2. The decimating DT filter may receive a first DT signal (e.g., the V1p and V1n signals in FIG. 2) at a first sample rate, filter and decimate the first DT signal by a factor of N, and provide a second DT signal (e.g., the V2p and V2n signals) at a second sample rate lower than the first sample rate. N may be greater than one. The active DT filter may filter the second DT signal and provide a third DT signal (e.g., the V3p and V3n signals) at the second sample rate.

The apparatus may further comprise a sampler, which may sample a continuous time signal based on a clock at the first sample rate and provide the first DT signal. The sampler may further double the voltage of the first DT signal relative to the voltage of the continuous time signal. In an exemplary design, the sampler may comprise first and second capacitors and switches, e.g., as shown in FIG. 3. The first and second capacitors may be charged by the continuous time signal during a first phase of the clock. The first and second capacitors may be coupled in series and may provide their charge to the first DT signal during a second phase of the clock.

In an exemplary design, the decimating DT filter may comprise a passive DT FIR filter, which may have N taps with equal or non-equal weights. The decimating DT filter may further comprise a passive DT IIR filter. In an exemplary design, the decimating DT filter may comprise a first capacitor and two banks of N capacitors, e.g., as shown in FIG. 5. The first capacitor (e.g., capacitor 510) may be charged by the first DT signal. The N capacitors (e.g., capacitors 532a to 532d) in the first bank may be charged by the first capacitor sequentially in N sample periods at the first sample rate. The N capacitors (e.g., capacitors 532e to 532h) in the second bank may be charged by the first capacitor sequentially in N sample periods after the N capacitors in the first bank have been charged. The N capacitors in the second bank may concurrently provide their charge to the second DT signal during a first interval when the N capacitors in the first bank are charged. The N capacitors in the first bank may concurrently provide their charge to the second DT signal during a second interval when the N capacitors in the second bank are charged. The decimating DT filter may comprise a pole determined by the capacitance of the first capacitor, the capacitance of each capacitor in the first and second banks, and the second sample rate, e.g., as shown in equation (1).

In an exemplary design, the active DT filter may comprise an active DT IIR filter. The decimating DT filter may have inband droop, and the active DT filter may have a peak within the passband to compensate for the inband droop. In an exemplary design, the active DT filter may comprise an amplifier and a bank of M capacitors, e.g., as shown in FIG. 7. The amplifier (e.g., amplifier 702) may receive the second DT signal and provide the third DT signal. The amplifier may perform input chopping and output chopping to upconvert a desired signal component in the second DT signal to higher frequency and reduce flicker noise. The amplifier may comprise a folded cascode amplifier, e.g., as shown in FIG. 11. The bank of M capacitors (e.g., capacitors 744) may be coupled to the amplifier. Each capacitor may be charged by the third DT signal in one sample period at the second sample rate and may provide its charge to the second DT signal M sample periods later, with M being greater than one. The M capacitors may be charged in sequential order in M consecutive sample periods. The active DT filter may comprise another bank of M capacitors for the inverted signal. The active DT filter may have a pole, which may be determined by the value of M, the capacitance of each capacitor in the active DT filter, the output capacitance of the decimating DT filter, and the second clock sample rate, e.g., as shown in equation (4).

In another exemplary design, an apparatus may comprise a mixer, an anti-aliasing filter, an amplifier, a decimating DT filter, an active DT filter, and an ADC, e.g., as shown in FIGS. 1 and 2. The mixer may downconvert an RF signal and provide a downconverted signal. The amplifier (e.g., a TIA) may amplify the downconverted signal (which may be a current signal) and provide an amplified signal (which may be a voltage signal). The anti-aliasing filter may filter the amplified signal and provide a continuous time signal. The sampler may sample the continuous time signal and provide a first DT signal at a first sample rate. The sampler may also perform voltage scaling (e.g., doubling). The decimating DT filter may filter and decimate the first DT signal by a decimation factor greater than one and may provide a second DT signal at a second sample rate lower than the first sample rate. The active DT filter may filter the second DT signal and provide a third DT signal at the second sample rate. The ADC may sample the third DT signal (e.g., with a configurable sampling rate) and provide digital samples. The first and second sample rates may be fixed integer multiples of the ADC sampling rate. The ADC sampling rate may also be a non-integer multiple of the first and second sample rates.

Figure 12:
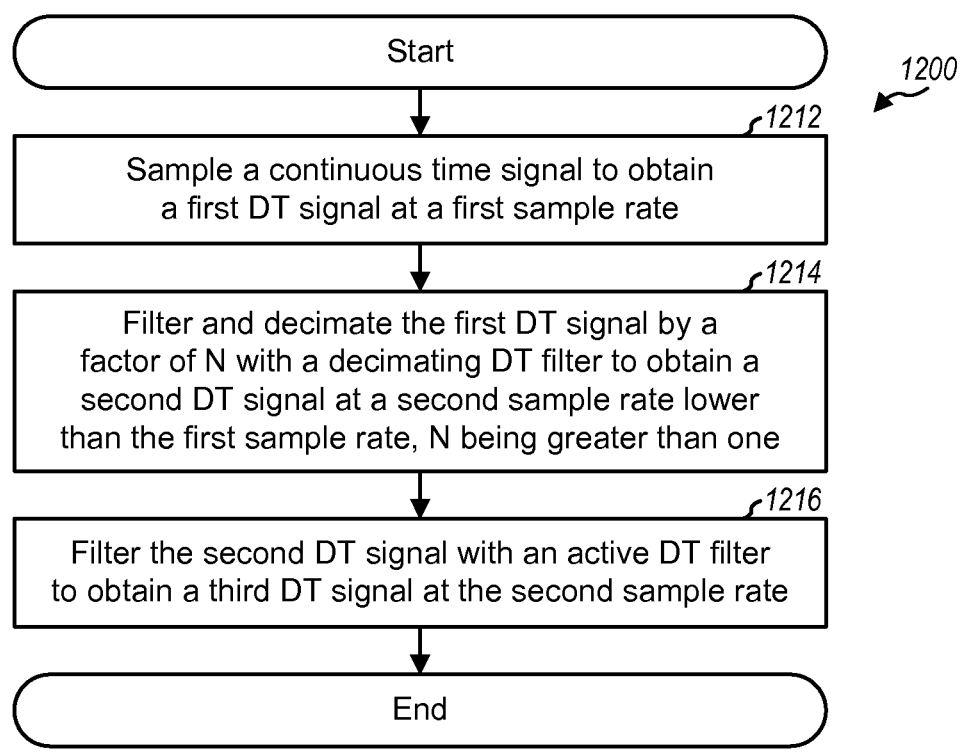
FIG. 12 shows a process for performing signal processing.

FIG. 12 shows an exemplary design of a process 1200 for performing signal processing. A continuous time signal may be sampled to obtain a first DT signal at a first sample rate (block 1212). The voltage of the first DT signal may be doubled relative to the voltage of the continuous time signal. The first DT signal may be filtered and decimated by a factor of N with a decimating DT filter to obtain a second DT signal at a second sample rate lower than the first sample rate (block 1214). N may be greater than one. The second DT signal may be filtered with an active DT filter to obtain a third DT signal at the second sample rate (block 1216).

In an exemplary design of block 1214, a first capacitor may be charged with the first DT signal. N capacitors may be sequentially charged with the first capacitor in N sample periods at the first sample rate and may then concurrently provide their charge to the second DT signal. In an exemplary design of block 1216, the second DT signal may be amplified to obtain the third DT signal. Each capacitor in a bank of capacitors may be charged with the third DT signal in one sample period at the second sample rate and may provide its charge to the second DT signal M sample periods later. M may be greater than one.

The DT lowpass filter described herein may be implemented on an IC, an analog IC, an RFIC, a mixed-signal IC, an ASIC, a printed circuit board (PCB), an electronics device, etc. The DT lowpass filter may also be fabricated with various IC process technologies such as complementary metal oxide semiconductor (CMOS), NMOS, PMOS, bipolar junction transistor (BJT), bipolar-CMOS (BiCMOS), silicon germanium (SiGe), gallium arsenide (GaAs), etc.

An apparatus implementing the DT lowpass filter described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus for performing signal processing, comprising:
   a passive decimating discrete time (DT) filter configured to receive a first DT signal at a first sample rate, filter and decimate the first DT signal by a factor of N, and provide a second DT signal at a second sample rate lower than the first sample rate, N being greater than one, the first and second DT signals being analog samples having analog values for discrete times during the filtering and decimating; and
   an active DT filter configured to filter the second DT signal and provide a third DT signal at the second sample rate and based in part on a delayed sample of the second DT signal, the second and third DT signals being analog samples having analog values for discrete times and the third DT signal being a combination of both passive and active DT filtering.

2. The apparatus of claim 1, further comprising:
   a sampler configured to sample a continuous time signal based on a clock at the first sample rate and provide the first DT signal.

3. The apparatus of claim 2, the sampler further configured to double a voltage of the first DT signal relative to a voltage of the continuous time signal.

4. The apparatus of claim 2, the sampler comprising
   a first capacitor charged by the continuous time signal during a first phase of the clock, and
   a second capacitor charged by the continuous time signal during the first phase of the clock, the first and second capacitors being coupled in series and configured to provide charge to the first DT signal during a second phase of the clock.

5. The apparatus of claim 1, the passive decimating DT filter comprising a passive DT finite impulse response (FIR) filter.

6. The apparatus of claim 5, the passive DT FIR filter comprising N taps with equal weight.

7. The apparatus of claim 5, the decimating DT filter further comprising a passive DT infinite impulse response (IIR) filter.

8. The apparatus of claim 1, the passive decimating DT filter comprising
   a first capacitor charged by the first DT signal, and
   a first bank of N capacitors charged by the first capacitor sequentially in N sample periods at the first sample rate, the N capacitors configured to concurrently provide charge to the second DT signal.

9. The apparatus of claim 8, the passive decimating DT filter further comprising
   a second bank of N capacitors charged by the first capacitor sequentially in N sample periods after the N capacitors in the first bank have been charged, the N capacitors in the second bank configured to concurrently provide charge to the second DT signal during a first interval when the N capacitors in the first bank are charged, and the N capacitors in the first bank configured to concurrently provide charge to the second DT signal during a second interval when the N capacitors in the second bank are charged.

10. The apparatus of claim 8, the passive decimating DT filter comprising a pole determined by capacitance of the first capacitor, capacitance of each capacitor in the first bank, and the second sample rate.

11. The apparatus of claim 1, the active DT filter comprising an active DT infinite impulse response (IIR) filter.

12. The apparatus of claim 1, the passive decimating DT filter having inband droop, and the active DT filter having a peak within passband to compensate for the inband droop.

13. The apparatus of claim 1, the active DT filter comprising
   an amplifier configured to receive the second DT signal and provide the third DT signal, and
   a bank of M capacitors coupled to the amplifier, each capacitor being charged by the third DT signal in one sample period at the second sample rate and configured to provide charge to the second DT signal M sample periods later, M being greater than one.

14. The apparatus of claim 13, the M capacitors being charged sequentially in M consecutive sample periods.

15. The apparatus of claim 13, the active DT filter comprising a pole determined by value of M, capacitance of each capacitor in the bank, output capacitance of the decimating DT filter, and the second sample rate.

16. The apparatus of claim 13, the amplifier configured to perform input chopping and output chopping to upconvert a desired signal component in the second DT signal to higher frequency and reduce flicker noise.

17. The apparatus of claim 13, the amplifier comprising a folded cascode amplifier.

18. An apparatus for wireless communication, comprising:
   a mixer configured to downconvert a radio frequency (RF) signal and provide a downconverted signal;
   an amplifier configured to amplify the downconverted signal and provide an amplified signal;
   a sampler configured to receive a continuous time signal obtained from the amplified signal, sampling the continuous time signal, and provide a first discrete time (DT) signal at a first sample rate;
   a passive decimating DT filter configured to filter and decimate the first DT signal by a decimation factor greater than one and provide a second DT signal at a second sample rate lower than the first sample rate, the first and second DT signals being analog samples having analog values for discrete times during the filtering and decimating; and
   an active DT filter configured to filter the second DT signal and provide a third DT signal at the second sample rate and based in part on a delayed sample of the second DT signal, the second and third DT signals being analog samples having analog values for discrete times and the third DT signal being a combination of both passive and active DT filtering.

19. The apparatus of claim 18, the amplifier comprising a trans-impedance amplifier (TIA) configured to receive a current signal for the downconverted signal and provide a voltage signal for the amplified signal.

20. The apparatus of claim 19, further comprising:
   an anti-aliasing filter configured to filter the amplified signal and provide the continuous time signal.

21. The apparatus of claim 18, further comprising:
   an analog-to-digital converter (ADC) configured to sample the third DT signal and provide digital samples.

22. The apparatus of claim 21, the ADC is configured to sample the third DT signal with a configurable sampling rate, the first and second sample rates being fixed integer multiples of the sampling rate.

23. A method of performing signal processing, comprising:
   receiving a first discrete time (DT) signal at a first sample rate;
   filtering and decimating the first DT signal by a factor of N with a passive decimating DT filter to obtain a second DT signal at a second sample rate lower than the first sample rate, N being greater than one, the first and second DT signals being analog samples having analog values for discrete times during the filtering and decimating; and
   filtering the second DT signal with an active DT filter to obtain a third DT signal at the second sample rate and based in part on a delayed sample of the second DT signal, the second and third DT signals being analog samples having analog values for discrete times and the third DT signal being a combination of both passive and active DT filtering.

24. The method of claim 23, further comprising:
   sampling a continuous time signal to obtain the first DT signal; and
   doubling voltage of the first DT signal relative to voltage of the continuous time signal.

25. The method of claim 23, the filtering and decimating the first DT signal comprising
   charging a first capacitor with the first DT signal,
   sequentially charging N capacitors with the first capacitor in N sample periods at the first sample rate, and
   concurrently providing charge from the N capacitors to the second DT signal.

26. The method of claim 23, the filtering the second DT signal comprising
   amplifying the second DT signal to obtain the third DT signal,
   charging each capacitor in a bank of capacitors with the third DT signal in one sample period at the second sample rate, and
   providing charge from each capacitor in the bank to the second DT signal M sample periods later, M being greater than one.

27. An apparatus for performing signal processing, comprising:
   means for receiving a first discrete time (DT) signal at a first sample rate;
   means for passively filtering and decimating the first DT signal by a factor of N to obtain a second DT signal at a second sample rate lower than the first sample rate, N being greater than one, the first and second DT signals being analog samples having analog values for discrete times during the filtering and decimating; and
   means for actively filtering the second DT signal with an active DT filter to obtain a third DT signal at the second sample rate and based in part on a delayed sample of the second DT signal, the second and third DT signals being analog samples having analog values for discrete times and the third DT signal being a combination of both passive and active DT filtering.

* * * * *